United States Patent [19]
Matsuhashi

[11] Patent Number: 5,108,952
[45] Date of Patent: Apr. 28, 1992

[54] METHOD OF DEPOSITING A TUNGSTEN FILM

[75] Inventor: Hideaki Matsuhashi, Tokyo, Japan

[73] Assignee: Oki Electric Industry Co., Ltd., Tokyo, Japan

[21] Appl. No.: 561,605

[22] Filed: Jul. 30, 1990

Related U.S. Application Data

[63] Continuation-in-part of Ser. No. 391,113, Aug. 9, 1989, abandoned.

[30] Foreign Application Priority Data

Aug. 22, 1988 [JP] Japan .................................. 63-206343

[51] Int. Cl.$^5$ ............................................. H01L 21/44
[52] U.S. Cl. .................................... 437/192; 437/173; 437/225; 427/53.1; 427/54.1
[58] Field of Search ...................... 437/192, 225, 173; 427/53.1, 54.1

[56] References Cited

U.S. PATENT DOCUMENTS 4,404,235  9/1983  Tarng et al. ........................ 437/192

OTHER PUBLICATIONS

Journal of Applied Physics 61 (6); Published Mar. 15, 1987; pp. 2365–2373; Akira Shintani, et al.: "Excimer laser initiated chemical vapor deposition of tungsten films on silicon dioxide".

Matsuhashi et al, "Evaluation of Laser CVD Tungsten for Gate Electrode", Jpn. Journal of Applied Physics 2 Letters, vol. 27, No. 11, Nov. 1988.

Adams, A. C., Dielectric and Polysilicon Film Deposition in Sze, S.M. VLSI Technology, McGraw-Hill (1983) p. 94.

Applied Physics Letters, vol. 45, No. 6, Sep. 1984, pp. 623–625, American Institute of Physics, Woodbury, New York, U.S.; T. F. Deutsch et al.: "Comparison of laser-initiated and thermal chemical vapor deposition of tungsten films".

Primary Examiner—Brian E. Hearn
Assistant Examiner—Laura M. Holtzman
Attorney, Agent, or Firm—Wenderoth, Lind & Ponack

[57] ABSTRACT

In a method of depositing a tungsten film on a gate oxide by means of laser CVD, using $WF_6$ and $H_2$ as raw material gases, the $H_2/WF_6$ flow ratio lies within the range 10–100, and the volumeric flow rate of the $WF_6$, which is defined as the ratio of the flow rate of $WF_6$ to the total pressure, lies within the range 0.04–0.01 sccm/Pa, so that the supply of $WF_6$ determines the deposition rate of the W film, whereby a low stress W film is obtained. Accordingly, peeling of the W film at the interface with the $SiO_2$ film and cracks can be avoided.

8 Claims, 5 Drawing Sheets

METHOD OF DEPOSITING A TUNGSTEN FILM

This application is a continuation-in-part of now abandoned application, Ser. No. 07/391,113 filed on Aug. 9, 1989, now abandoned.

BACKGROUND OF THE INVENTION

This invention concerns a method of depositing a film of tungsten which is used as the gate metal in semiconductor devices.

In the prior art, films of tungsten (W), a gate metal in semiconductor devices, were generally formed on a film of substrate gate oxide of $SiO_2$ by means of sputtering.

This method however suffered from the following disadvantages:
(i) Step coverage over the $SiO_2$ step is poor,
(ii) Damage to the gate oxide due to sputtering occurs easily,
(iii) There is a risk that impurities in the target material will contaminate the W film, and
(iv) Problems of properties such as high resistance occur easily.

CVD (Chemical Vapor Deposition) of the W film was therefore proposed as one way of eliminating these problems.

In the deposition of these W films by CVD, tungsten hexafluoride ($WF_6$) and hydrogen ($H_2$) are used as reaction gases. By the usual thermal CVD method, however, W films are not deposited on a silicon oxide film.

It was therefore proposed to deposit the W film by laser CVD instead of thermal CVD, as disclosed in the literature (A. Shintani, J. Appl. Physics, Vol. 61, No. 6, March 1987, p. 2365-2366). (The laser CVD will be described in detail later).

By means of the laser CVD method, it is possible to deposit a W film on the surface of a silicon oxide film. The adhesion between the film and the W film is however poor, and under certain conditions, the W film may peel off at the interface with the silicon oxide film or cracks may occur in the W film as it is being formed.

In the method of the above reference, it is proposed that a silicon substrate covered by a silicon oxide film be heated to 350° C. or more, and the $H_2/WF_6$ flow ratio be no less than 2, in order to form a stable W film on the silicon oxide.

It has been however found that if the W film was deposited by the above laser CVD method under the above conditions, the W film tended to peel off at the interface with the $SiO_2$ film as film thickness increased when the tensile stress in the W film was large, and it was therefore difficult to deposit a stable film on the silicon oxide on the substrate.

SUMMARY OF THE INVENTION

This invention was conceived to overcome the above problems. It aims to provide a means of depositing a stable W film with low tensile stress on a silicon oxide film using the laser CVD method.

This invention provides deposition of a film of tungsten (W) which is used as a gate metal in semiconductor devices, by means of laser CVD on silicon oxide on a substrate using $WF_6$ and $H_2$ as raw material gases, wherein the ratio of flow rate of the $H_2$ to the flow rate of the $WF_6$ ($H_2/WF_6$ flow ratio lies within the range 10-100, and the volumetric flow rate of the $WF_6$, which is defined as the ratio of the flow rate of $WF_6$ to the total pressure, lies within the range 0.04-0.01 sccm/Pa so that the supply of $WF_6$ determines the rate of reaction for the deposition of the W film, whereby a low stress W film is obtained.

In this invention, as described in the embodiments, a W film is deposited on a substrate by laser CVD, wherein the $H_2/WF_6$ flow ratio lies within the range 10-100, and the volumetric flow rate of $WF_6$ lies within the range 0.04-0.01 sccm/Pa. By this means the stress in the W film falls sharply, and peeling of the W film at the interface with the $SiO_2$ film and cracks can be avoided.

DETAILED DESCRIPTION OF THE EMBODIMENTS

An embodiment of this invention will now be described with reference to the diagrams below.

Figure 1:
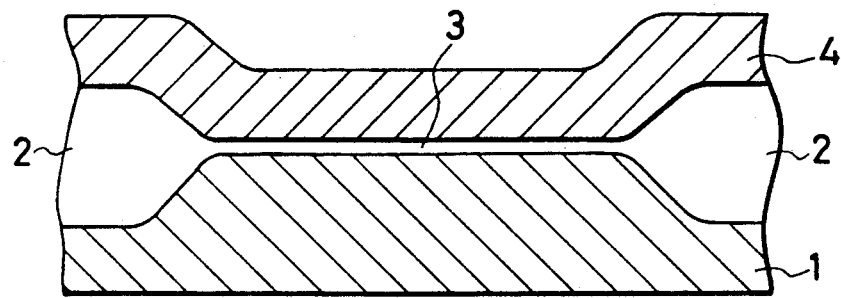
FIG. 1 is a cross-section of a semiconductor device for the purpose of describing this invention.
Figure 2:
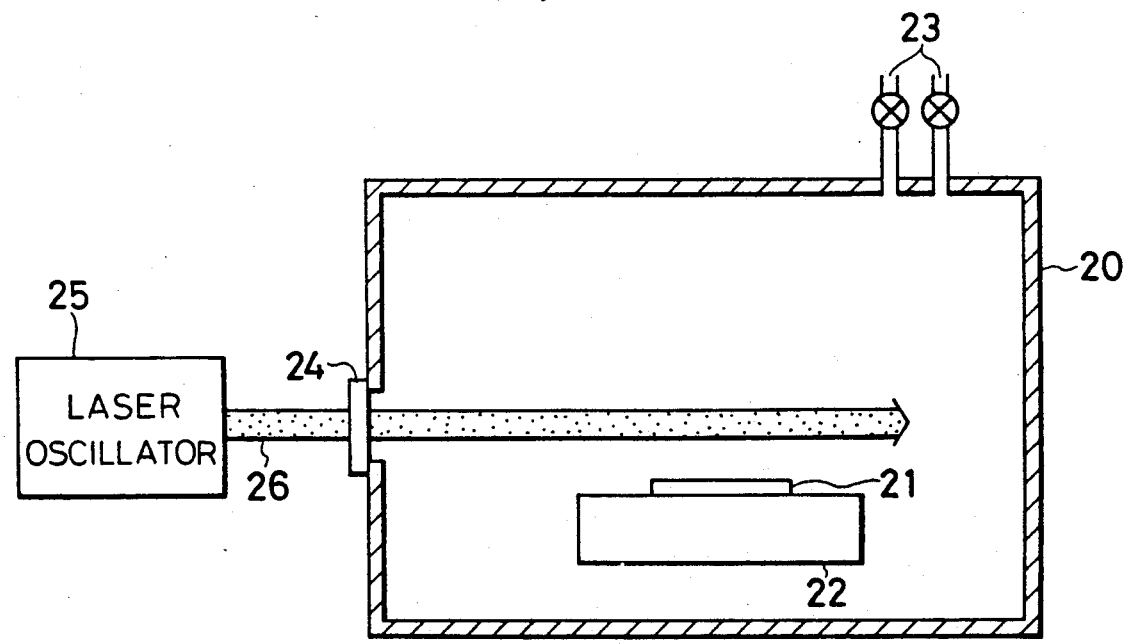
FIG. 2 is a schematic diagram of a laser CVD apparatus.

FIG. 1 is a cross-section of a semiconductor device. Firstly, a silicon oxide film 2 for element isolation is formed on the substrate 1 by the usual method, and a silicon oxide film 3 of approx. 200 Angstrom thickness is formed by thermal oxidation to act as a gate oxide film. A W film 4 is then deposited to a desired thickness on the silicon oxide film 2 by laser CVD. The W film 4 is continuous throughout the entire surface of the substrate. FIG. 2 is a schematic diagram of the laser CVD apparatus.

In this apparatus, a substrate 21 on which has been formed a gate oxide film as described above, is placed on a heater 22 in a reaction chamber 20, and chamber 20 is then evacuated to approx. $10^{-3}$ Pa by an evacuating device not shown in the figure. The substrate 21 is then heated to a temperature of approx. 400° C. by the heater 22, and tungsten hexafluoride ($WF_6$) and hydrogen ($H_2$) are introduced through gas inlets 23 to desired partial pressures $PWF_6$ and $PH_2$. In this example, the partial pressures are 4 Pa and 100 Pa, respectively. At this time, it is preferable that approx. 400 sccm (standard cubic centimeters per minute) of argon (Ar) gas is blown toward the inner surface of the laser beam window 24 to prevent deposition of a W film on the laser beam window 24.

A laser oscillator 25 installed outside the reaction chamber 20 is then activated, and laser beam 26 passes into the chamber via window 24, and passes the approx. 10 mm above the surface of the substrate. The wavelength of the laser must be selected such as to be able to excite the reaction gases, and in this case, a wavelength of 193 nm emitted by an ArF excimer laser was used. Further, the energy of the laser beam was 150 mJ/pulse, and its pulse rate was 50 PPS. The laser beam 26 excites the above reaction gases, and a W film of approx. 3000 Angstrom thickness is deposited on the substrate. In this case, the width of the laser beam was approx. 20 mm, but as this is small compared with the size of the substrate 21 having the gate oxide film and being treated (usually of the order of 15 cm), the substrate may be moved or rotated so as to deposit a W film of uniform thickness.

In the process of depositing W films on such substrates, it was found that, if the supply of $WF_6$ was adjusted by varying the volumetric flow rate $SWF_6$ of $WF_6$, which is defined as the ratio of flow rate of $WF_6$ to the total pressure, into the reaction chamber so that it determines the deposition rate of the W film, then the stress in the W film could be controlled.

DEPENDENCE OF DEPOSITION RATE OF W STRESS ON THE $H_2$ PARTIAL PRESSURE

Figure 3:
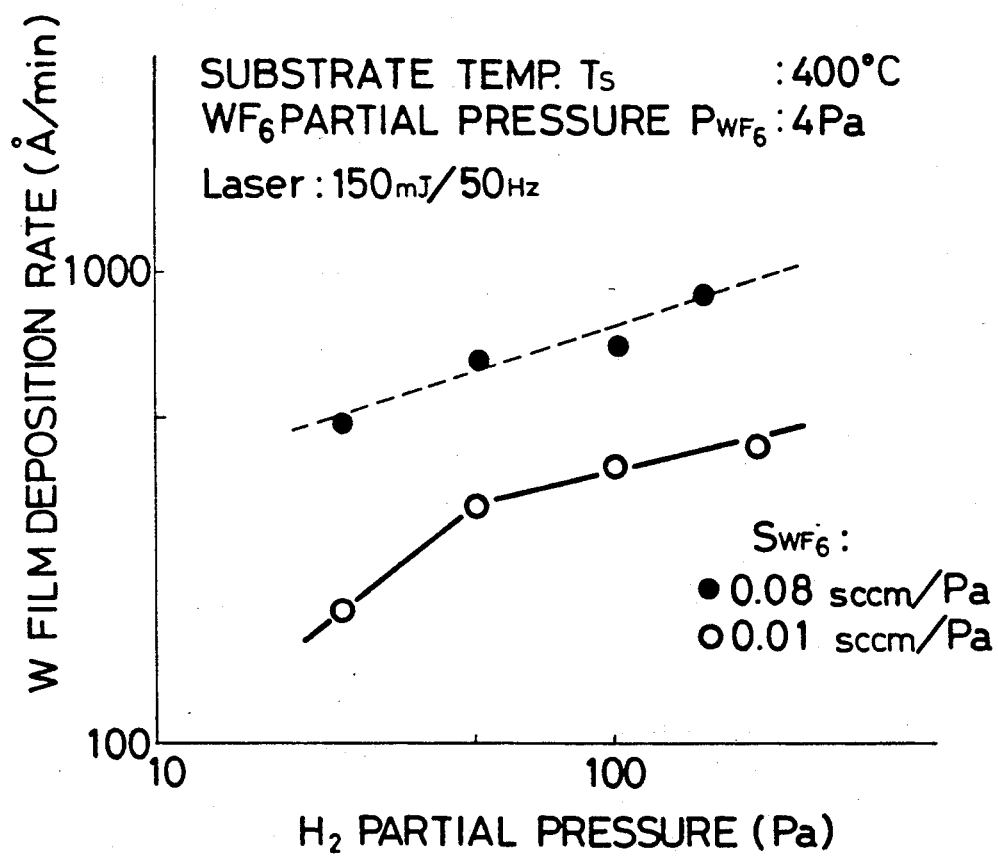
FIG. 3 shows the dependence of the deposition rate of a W film on an $H_2$ film upon the $H_2$ partial pressure.

First, an explanation will be made as to how the rate of reaction, which deposits the W film, is determined by the volumetric flow rate of $WF_6$ when the volumetric flow rate is reduced. FIG. 3 shows the results obtained under the above conditions when $SWF_6$ is 0.08 and 0.01 sccm/Pa. From FIG. 3, it is seen that regardless of the partial pressure of hydrogen, the deposition rate of the W film is lower at a $SWF_6$ of 0.01 sccm/Pa than at 0.08 sccm/Pa. In other words, the rate of supply of $WF_6$ is rate-determining in the deposition of the W film, when $SWF_6$ is 0.01 sccm/Pa.

In general, in laser CVD, the deposition rate of the W film is determined by the values of the substrate temperature, the partial pressure of $WF_6$ and of $H_2$, and the laser power. This however applies only to the case where the reaction gases are sufficient, and if the quantity of these gases is insufficient, the deposition rate of the W film will be lower, than in the case where the quantity of these gases is sufficient. When $SWF_6$ is 0.08 sccm/Pa, the deposition rate of the W film is determined by the former case; and when it is 0.01 sccm/Pa, as there is sufficient $H_2$, the deposition rate of the W film is determined by the supply of $WF_6$.

DEPENDENCE OF RESIDUAL STRESS IN W FILM ON $H_2$ PARTIAL PRESSURE

Figure 4:
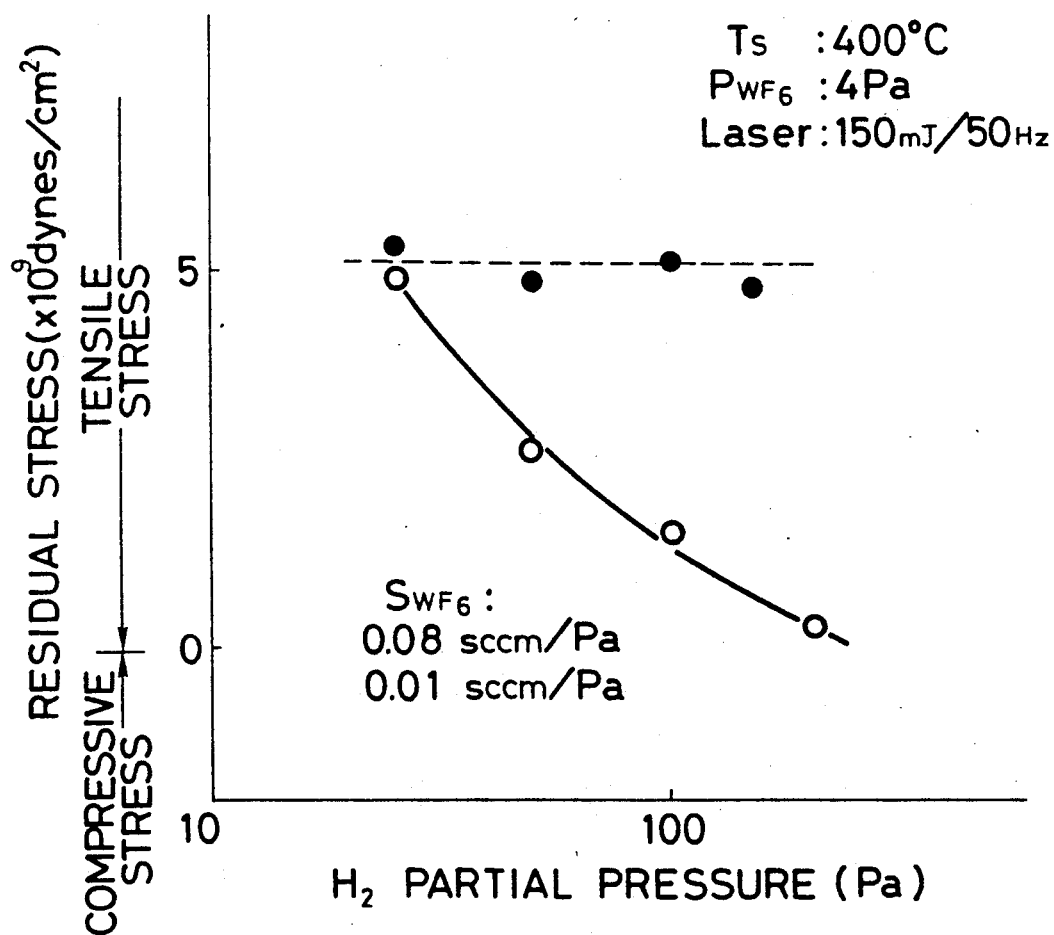
FIG. 4 shows the dependence of the residual stress in a W film on $H_2$ partial pressure.

FIG. 4 shows the residual stress in a W film deposited under identical conditions to those of FIG. 3. From the figure, it is seen that if the film is formed at an $SWF_6$ volumetric flow rate of 0.08 sccm/Pa, i.e. if the supply of $H_2$ and $WF_6$ is sufficient, the residual stress in the film is independent of the partial pressure of $H_2$, and has a high constant value of about $5 \times 10^9$ dynes/cm$^2$. As a result, peeling of the W film at the interface with the substrate and cracks occurred easily. On the other hand, when the volumetric flow rate, $SWF_6$, was 0.01 sccm/Pa, the stress dropped sharply in comparison to the case of 0.08 sccm/Pa, and this difference was more marked the higher the partial pressure of $H_2$.

DETERMINATION OF VOLUMETRIC FLOW RATE $SWF_6$

An explanation will next be made on the range of volumetric flow rates $SWF_6$ within which the deposition of the W film and the stress in it could be controlled.

Figure 5A:
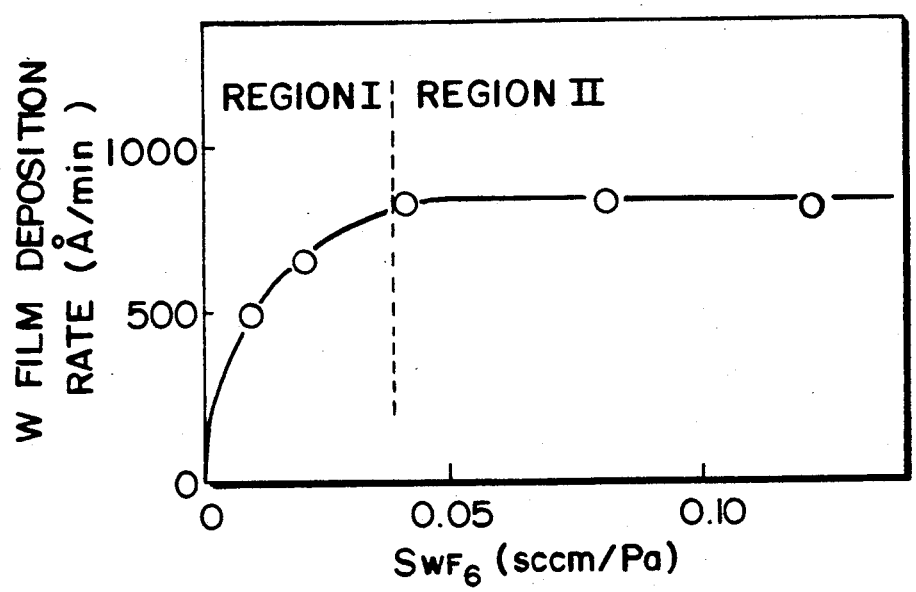
FIGS. 5a and 5b show the dependence of deposition the rate of a W film and the residual stress on the volumetric flow rate of $WF_6$.
Figure 5B:
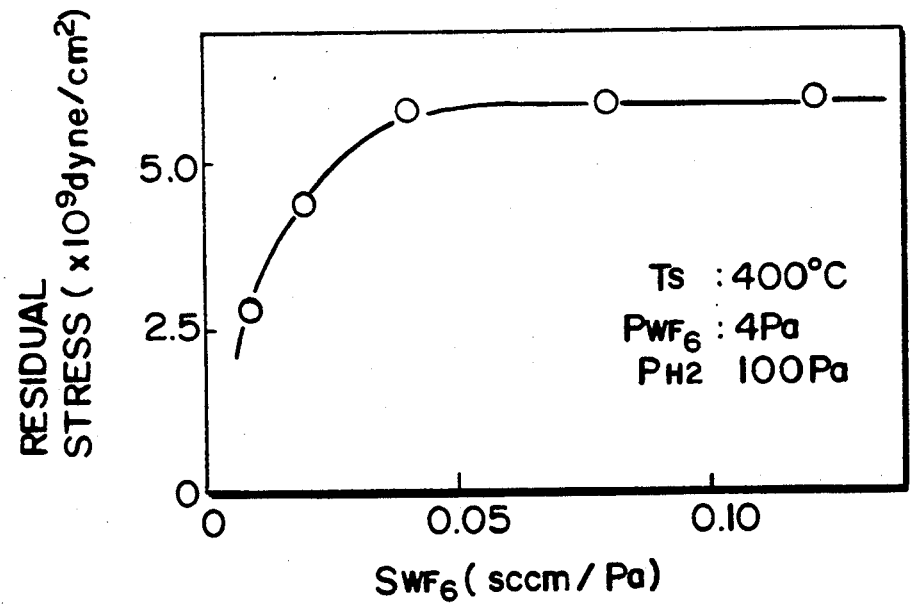

FIG. 5 shows the dependence of the deposition rate of a W film and the residual stress on the volumetric flow rate of $WF_6$. From this figure is seen that except in Region II where $SWF_6$ has a high value, the residual stress in the film drops sharply and a film with a low stress is obtained in Region I where the upper limit of $SWF_6$ is 0.04 sccm/Pa.

On the other hand, it is seen that when $SWF_6$ is below 0.01 sccm/Pa, the deposition rate of the W film is very much reduced.

RELATION BETWEEN RESIDUAL STRESS IN W FILM AND $H_2/WF_6$ FLOW RATIO

Figure 6:
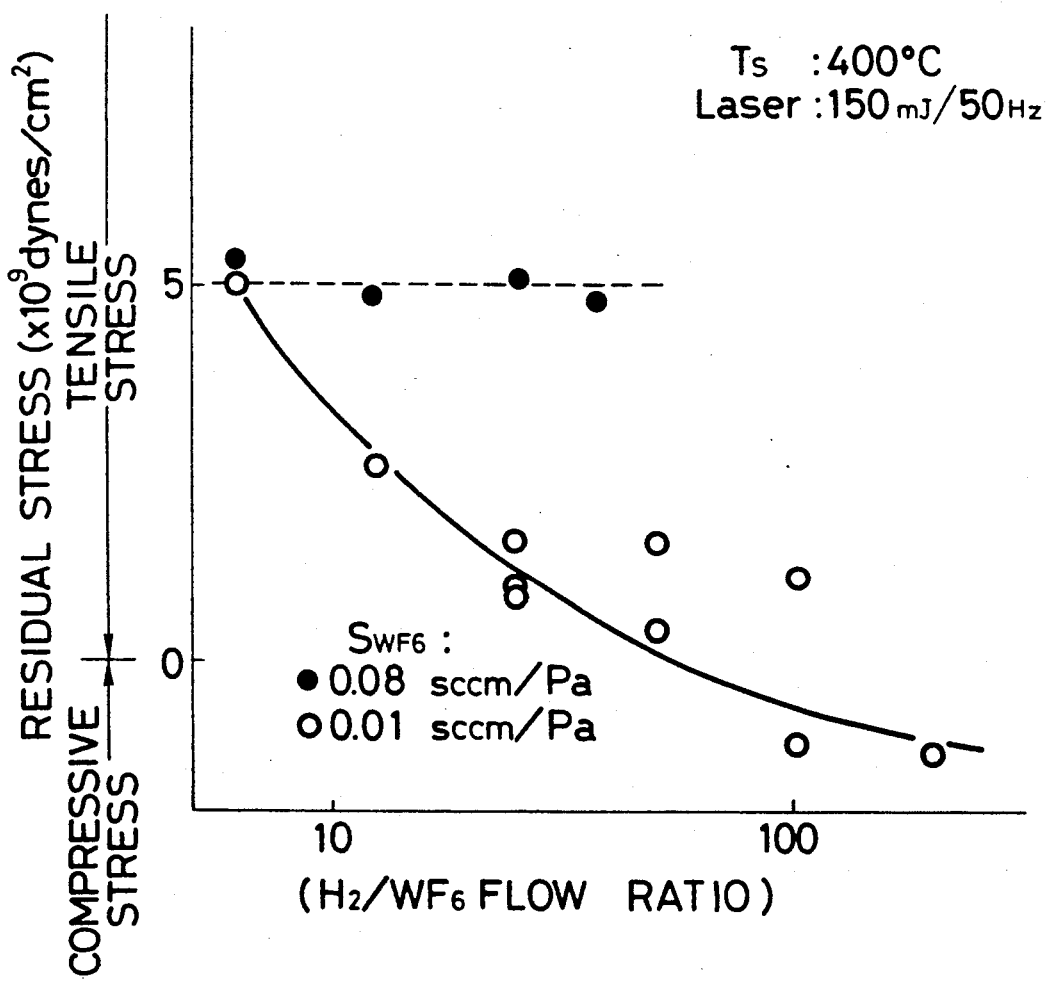
FIG. 6 shows the relation between residual stress in the W film and the $H_2/WF_6$ flow ratio.

FIG. 6 shows the relation between the residual stress in the W film and the $H_2/WF_6$ flow ratio (K). From the figure, it is seen that if the volumetric flow rate of $WF_6$ is fixed at, for example, 0.01 sccm/Pa, the tensile stress in the W film decreases the more K rises above 10, and when K reaches 100 and over, a compressive stress then appears. It is thus evident that if the volumetric flow rate of $WF_6$ is fixed at a low value, such as 0.01 sccm/Pa, the stress in the W film can be controlled, by varying the $H_2/WF_6$ flow ratio.

When a W film is deposited on a substrate by the laser CVD method using $WF_6$ and $H_2$ as raw material gases, therefore, it is possible to obtain a low stress film by arranging the volumetric flow rate of $WF_6$ to be 0.04-0.01 sccm/Pa so that the deposition rate of W film is determined by the supply of $WF_6$, and varying the $H_2/WF_6$ flow ratio within the range 10-100. It is thus possible to deposit a stable W film on an $SiO_2$ film which does not peel off at the W/$SiO_2$ interface on the substrate or crack.

When a W film, which constitutes a gate electrode, is deposited on a $SiO_2$ film by laser CVD according to the method of this invention, the conditions are arranged such that the volumetric flow rate of $WF_6$ is set such that the supply of $WF_6$ determines the deposition rate of the W film, and the $H_2/WF_6$ flow ratio is set within a suitable range, a W film with low stress can be obtained, and a stable W film can be obtained which does not peel off at the W/$SiO_2$ interface or crack as it did in the prior art.

What is claimed is:

1. A method of depositing a stable film of tungsten (W) having low tensile stress used as a gate metal in semiconductor devices, said film being deposited by means of laser chemical vapor deposition (CVD) on a substrate using $WF_6$ and $H_2$ as raw material gases, said film being continuous throughout the entire surface of said substrate, wherein the ratio of the flow rate of said $H_2$ to the flow rate of said $WF_6$ gas lies within the range of 10-100, and the volumetric flow rate of $WF_6$, which is defined as the ratio of the flow rate of $WF_6$ to the total pressure, lies within the range of 0.04-0.01 sccm/Pa so that the supply of $WF_6$ determines the rate of reaction for formation of the W film.

2. A method of depositing a film of tungsten on a semiconductor device by means of laser chemical vapor deposition, comprising the steps of:

placing the semiconductor substrate in a reaction chamber, evacuating the reaction chamber, introducing into the reaction chamber $WF_6$ and $H_2$ gases, applying a laser beam to the space immediately above the semiconductor substrate, wherein the ratio of the flow rate of said $H_2$ to the flow rate of said $WF_6$ gas lies within the range of 10-100, and the volumetric flow rate of $WF_6$, which is defined as the ratio of he flow rate of $WF_6$ to the total pressure, lies within the range of 0.04–0.01 sccm/Pa so that the supply of $WF_6$ determines the deposition rate of the W film.

3. A method according to claim 2, wherein the semiconductor substrate has a silicon dioxide film, and said film of tungsten is formed on the silicon dioxide film.

4. A method according to claim 2, wherein the $WF_6$ and $H_2$ gases are introduced to partial pressures of 4 Pa and 100 Pa, respectively.

5. A method according to claim 2, wherein the tungsten film is formed to a thickness of about 3000 Angstrom.

6. A method according to claim 2, wherein the substrate is heated to about 400° C. while the laser CVD is performed.

7. A method according to claim 2, wherein the wavelength of the laser is selected to excite the reaction gases.

8. A method according to claim 7, wherein the substrate is moved or rotated with respect to the laser beam.

* * * * *